(12) United States Patent
Sivaraman et al.

(10) Patent No.: US 6,966,043 B2
(45) Date of Patent: Nov. 15, 2005

(54) METHOD FOR DESIGNING MINIMAL COST, TIMING CORRECT HARDWARE DURING CIRCUIT SYNTHESIS

(75) Inventors: Mukund Sivaraman, Mountain View, CA (US); Shail Aditya Gupta, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 96 days.

(21) Appl. No.: 10/266,831

(22) Filed: Oct. 7, 2002

(65) Prior Publication Data

US 2004/0068706 A1 Apr. 8, 2004

(51) Int. Cl.$^7$ .............................................. G06F 17/50
(52) U.S. Cl. ...................... 716/6; 716/1; 716/2; 716/17
(58) Field of Search ............................. 716/1, 2, 6, 17, 716/18; 717/160

(56) References Cited

U.S. PATENT DOCUMENTS 6,324,678 B1 * 11/2001 Dangelo et al. ............... 716/18
6,493,863 B1 * 12/2002 Hamada et al. ................ 716/18
6,507,947 B1 * 1/2003 Schreiber et al. ........... 717/160

OTHER PUBLICATIONS

U.S. Appl. No. 09/378,298, Schreiber et al.
U.S. Appl. No. 10/266,826, Sivaraman et al.
U.S. Appl. No. 10/266,830, Sivaraman et al.
Leiserson, C.E. and J. B. Saxe, "Retiming Synchronous Circuitry", Systems Research Center of Digital Equipment Corporation in Palo Alto, California. (Aug. 20, 1986).
Kirkpatrick, T.I. and N. R. Clark, "PERT as an Aid to Logic Design", IBM Journal of Research and Development, vol. 10 (1996) pp. 135–141.
Devadas,S., et al. "Computation of Floating Mode Display in Combinational Logic Circuits: Theory and Algorithms"IEEE Transactions n Computer–Aided Design of Integrated Circuits and Systems, vol. 12 (Dec. 1993) pp. 1913–1923.
Charlesworth, A.E. "An Approach to Scientific Array Processing: The Architectural Design of the AP–120B/FPS–164 Family", Computer, vol 14, No. 9 (Sep. 1981) pp. 18–27.
Rau, B. R. "Iterative Modulo Scheduling", International Journal of Parallel Programming, vol. 24, No. 1 (1996) pp. 3–64.
"Managing Design Complexity with Behavioral Synthesis", [on–line] [Retrieved On: Sep. 10, 2002] Retrieved fr m: http://www.synopsis.com/products/beh_syn/beh_syn_br.html (pp.1–14).
Behavioral Compiler User Guide, Chapter 3, "Optimizing Timing and Area," pp. 3–1 through 3–78, v. 2000.11.
Malik, S. "Analysis of Cyclic Combinational Circuits" IEEE Transactions on Computer–Aided Design of Intergrated Circuits and Systems, vol. 13, No. 7 (Jul. 1994) pp. 950–956.
Srinivasan, A. and Sharad Malik. "Practical Analysis of Cyclic Combinational Circuits" IEEE Custom Integrated Circuits Confer nce (1996) pp. 381–384.
Andreas Kuehlman et al—"Timing Analysis in High–Level Synthesis"—Proceedings of the IEEE/ACM International Conference on Computer Aided Design—Nov. 1992—pp. 349–354.

(Continued)

Primary Examiner—Thuan Do

(57) ABSTRACT

A method of considering circuit timing requirements during the circuit design process, comprising receiving a clock cycle-time constraint; receiving delay characteristics of hardware resources from a macrocell library; receiving an operation, an alternative clock cycle associated with said operation and an alternative hardware resource associated with said operation; and determining validity of the received alternative with respect to timing constraints using a hardware structural representation of the program graph.

26 Claims, 4 Drawing Sheets

OTHER PUBLICATIONS

John A Nester et al—"SALSA: A New Approach to Scheduling With Timing Constraints"—Proceedings of the International Conference on Computer Aided Design—Nov. 1990—pp. 262–265.

Tai A Ly et al—"Applying Simulated Evplution to Scheduling in High Level Synthesis"—Proceedings of the 33rd Midwest Symposium on Circuits and Systems—Aug. 1990—172–175.

* cited by examiner

US 6,966,043 B2

METHOD FOR DESIGNING MINIMAL COST, TIMING CORRECT HARDWARE DURING CIRCUIT SYNTHESIS

CROSS-REFERENCE TO RELATED APPLICATIONS

The present application is related to commonly assigned U.S. patent application Ser. No. 10/266,830 entitled "SYSTEM FOR AND METHOD OF CLOCK CYCLE-TIME ANALYSIS USING MODE-SLICING MECHANISM," and U.S. patent application Ser. No 10/266,826 entitled "METHOD OF USING CLOCK CYCLE-TIME IN DETERMINING LOOP SCHEDULES DURING CIRCUIT DESIGN," filed concurrently herewith, the disclosures of which are hereby incorporated by reference in their entireties.

FIELD OF THE INVENTION

The present invention is directed to digital circuit synthesis, and, in particular, to improving the quality of digital circuits produced by high-level synthesis by incorporating timing analysis considerations.

BACKGROUND

The combination of continuing advances in technology and reduced production costs have led to a proliferation of electronic devices that incorporate or use advanced digital circuits. These electronic devices include both traditional electronic devices such as desktop computers, laptop computers, hand-held computing devices, such as Personal Digital Assistants (PDAs) and hand-held computers, as well as non-traditional devices such as cellular telephones, printers, digital cameras, facsimile machines, and household and business appliances. The digital circuits included in these electronic devices may be used to provide the basic functionality of the electronic devices or may be used to provide additional, desirable features.

For each of these electronic devices it is desirable to reduce the overall cost of the device. This reduction in cost may be accomplished by reducing the cost of the digital circuits incorporated into the device. The cost of the digital circuits may be reduced by reducing the amount of silicon used to fabricate each digital circuit. However, it is important that the digital circuit still meet the appropriate functional and performance requirements. Performance requirements are expressed as a combination of several metrics: throughput (number of tasks executed per clock cycle), latency (number of clock cycles to complete a single task), and clock speed.

Given a functional and performance requirement, synthesis approaches typically try to design a digital circuit with the required functionality that has minimal cost and still meets the performance requirements. FIG. 1 is a block diagram of a typical process for the high-level synthesis of digital circuits. As illustrated, the design process takes as input functional specification 101 of the application and desired performance requirement 102 and performs a number of steps including: analysis, transformations and optimizations step 103, storage determination step 104, functional unit allocation step 105, operation scheduling and resource binding step 106, and hardware synthesis step 107. The structural Register-Transfer-Level (RTL) description of the circuit is then produced as output 108.

The functional specification input 101 is a high level specification that expresses the behavior of the application. It is usually an executable program in a language that the high-level synthesis process understands. If it is a textual document, then the equivalent executable code may need to be written for the purposes of synthesis. The performance requirement 102 represents the throughput, latency, clock speed, etc. required of the synthesized digital circuit.

The program is analyzed and transformed in step 103 to expose opportunities for meeting the desired performance and for cost reduction. This includes techniques to exploit parallelism at the task-level, interation-level, and instruction-level, and other traditional compiler optimizations like common sub-expression elimination, dead code elimination, etc.

In step 104, storage is determined for the variables in the program. Data structures contained in the program may be mapped to global memory while others may be mapped to local memory or possibly to internal registers.

In step 105, functional units are allocated for the operations in the transformed and optimized program. Program operations may include, but are not limited to, additions, subtractions, multiplication, division, etc. A functional unit (FU) refers to components such as adders, multipliers, load-store units and similar components. Each of these functional units is capable of executing one or more type of operations. Allocating functional units entails the process of allocating a minimal-cost set of hardware components that can execute the operations in the program graph and meet the required performance. For example, given a program with additions, subtractions, multiplications, memory loads, and memory stores, step 105 may allocate two multiply-adders, three subtractors, and one load-store functional unit.

Operation scheduling and resource binding are performed in step 106. Operation scheduling involves assigning the start of each operation to a specific clock cycle. For example, an add operation may be assigned to start executing on clock cycle number 23. Resource binding entails selecting, for each operation, a specific functional unit to be used for its execution. For example, in allocating functional units step 105, a determination may have been made that two adders, ADDER1 and ADDER2, are required to be included in the circuit design. In resource binding step 106, a particular addition operation may be bound to ADDER1, i.e., it is assigned to execute on ADDER1.

Typically, unscheduled operations (operations that have not been associated with a clock cycle and a functional unit) are addressed in some order that is either pre-assigned or is dynamically determined during scheduling. Once an unscheduled operation is selected, several alternatives are considered for scheduling and binding this operation. An alternative refers to a specific clock cycle and functional unit that this operation can be scheduled and bound on. The alternatives for an unscheduled operation are derived by determining the available clock cycles and functional units to execute this operation. For example, if there are three possible clock cycles and two possible adder functional units for an operation that requires an adder, there would be six alternatives to be analyzed for scheduling the operation. The scheduler/binder may also undo some prior decisions due to dependency and/or resource-conflict issues. For one example of a scheduling and binding algorithm, see B. R. Rau, "ITERATIVE MODULO SCHEDULING," International Journal of Parallel Processing, vol. 24, pp. 3–64, 1996, the disclosure of "A" which is hereby incorporated by reference herein. This document is also available as HP Labs Tech. Report HPL-94-115 from Hewlett-Packard Co.

Hardware synthesis step 107 occurs after completion of operation scheduling and resource binding step 106. Hardware synthesis includes the processes of allocating the registers to hold data values and connecting the hardware functional units to each other and from/to allocated storage elements. These interconnections are based on the data flow of the program and the scheduling & binding decisions taken in previous steps.

Finally, the structural description of the circuit is produced as output 109. This RTL circuit description can then be taken through subsequent logic synthesis and place & route steps to produce the final circuit.

The high-level synthesis process may include other steps not shown in FIG. 1. Also, the high-level synthesis process of performing analysis, transformations and optimizations, storage determination, functional unit allocation, operation scheduling and resource binding, and hardware synthesis maybe performed serially in the sequence shown in FIG. 1, or serially in a different sequence, or several of these steps may be combined and performed in parallel. One example of high-level synthesis currently available that performs several steps of the overall process is PICO-NPA. Refer to FIG. 13 and Section 5 of U.S. patent application Ser. No. 09/378, 298, filed Aug. 20, 1999, entitled "PROGRAMMATIC SYNTHESIS OF PROCESSOR ELEMENT ARRAYS", the disclosure of which is hereby incorporated by reference herein.

As mentioned above, the overall objective of the operation scheduling and resource binding step is to associate a specific clock cycle and functional unit to each operation in the program, such that the specified performance requirements are met and the cost of the hardware is minimized. In addition to meeting latency and throughput performance requirements, it is important to ensure that the resulting hardware meets the timing constraints imposed on the circuit paths due to the specified clock frequency. Circuit paths are combinational paths from a primary input to a latch/register, or from a latch/register to another latch/register, or from a latch/register to a primary output, or from a primary input to a primary output.

SUMMARY OF THE INVENTION

The present invention is directed to a method of considering circuit timing requirements during the circuit design process, comprising receiving a clock cycle-time constraint; receiving delay characteristics of hardware resources from a macrocell library; receiving an operation, an alternative clock cycle associated with said operation and an alternative hardware resource associated with said operation; and determining validity of the received alternative with respect to timing constraints using a hardware structural representation of the program graph.

DETAILED DESCRIPTION

Figure 2:
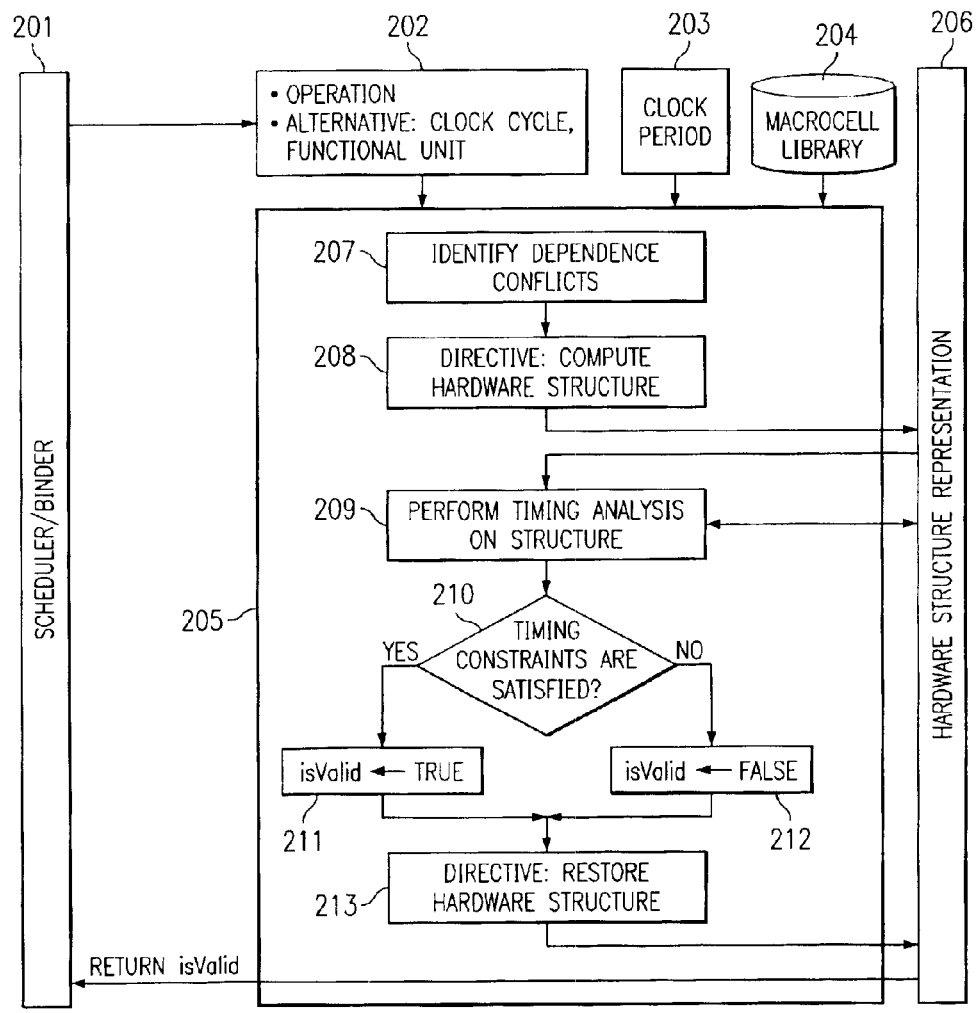
FIG. 2 shows a flow diagram of the mechanism to enable scheduling and binding to produce hardware that meets the given clock frequency of one embodiment of the present invention.

FIG. 2 shows a flow diagram of the mechanism to enable scheduling and binding to produce hardware that meets the given clock frequency requirement. The present invention, timing tracker 205, works in conjunction with scheduler/binder 201 to achieve this objective. Scheduler/binder 201 provides as input 202 to timing tracker 205, the following: an operation; an alternative, including an alternative clock cycle and an alternative functional unit, expressed as an ordered pair: <clock cycle, functional unit>.

Timing tracker 205 also receives a clock period specification 203 and has access to macrocell library 204. Macrocell library 204 contains the delay for all hardware resources (functional units, registers, multiplexers and other logic-switching elements). The delay associated with each of these macrocells is pre-characterized by $\Delta in_i$, $\Delta out_i$, $\Delta thru_{i,j}$. $\Delta in_i$ refers to the longest combination path delay from the primary input i of the macrocell to a latch inside the macrocell and is a function of the transition time at the primary input. If there is no such path (for instance, for a combinational macrocell) then $\Delta in_i$ is irrelevant. $\Delta out_i$ refers to the longest combinational path delay from a latch inside the macrocell to the primary output i of the macrocell, and is a function of the capacitive load on the primary output. If there is no such path (for instance, for a combinational macrocell) then $\Delta out_i$ is irrelevant. $\Delta thru_{i,j}$ refers to the longest combinational path delay from the primary input i of the macrocell to the primary output j of the macrocell and is a function of the primary input transition time and the primary output capacitive load. If there is no such path (for instance, for a sequential macrocell) then $\Delta thru_{i,j}$ is irrelevant. These macrocell delays, $\Delta in_i$, $\Delta out_i$, and $\Delta thru_{i,j}$ may also be functions of macrocell-specific parameters such as width. Furthermore, they correspond to specific hardware implementation of the macrocell, for example, the fastest implementation, the smallest implementation, etc., the choice of which may be controlled externally.

Figure 1:
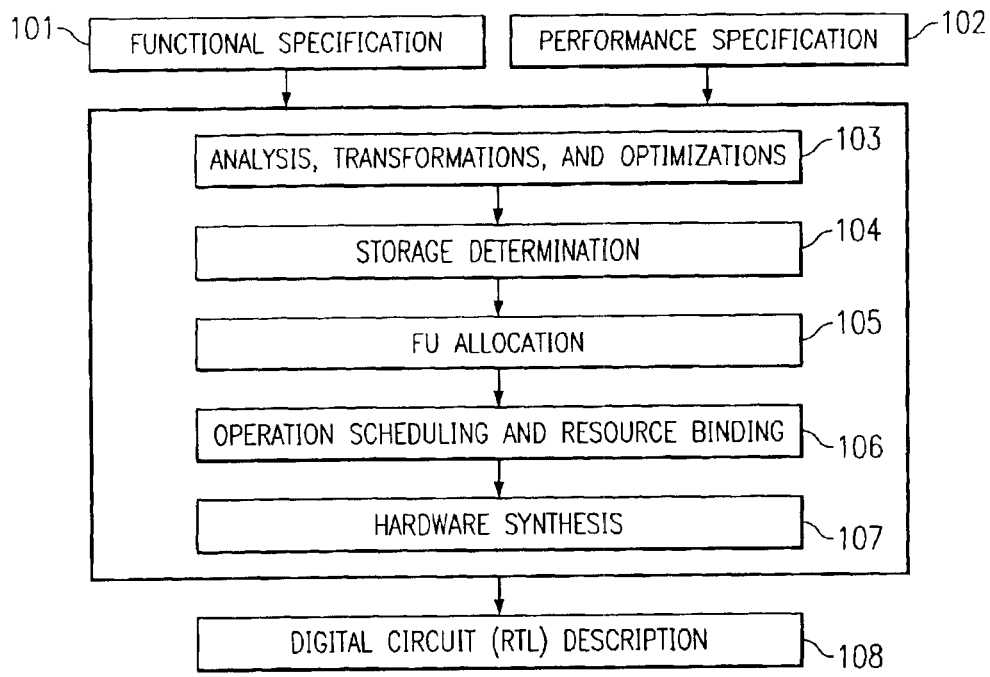
FIG. 1 is a block diagram of one process for the high-level synthesis of digital circuits.
Figure 3:
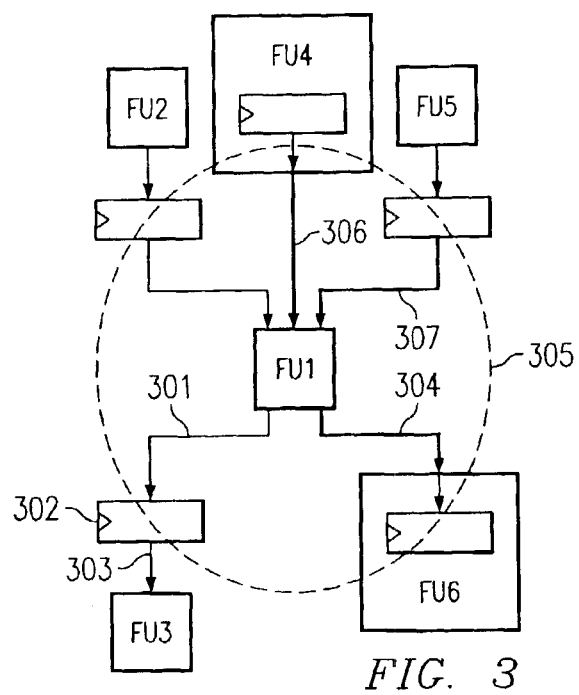
FIG. 3 shows an example of determining the zone of influence where incremental timing analysis is performed when the hardware structural representation is updated with a scheduling alternative.

Timing tracker 205 uses an internal representation of the partial hardware structure as it is being defined during scheduling and binding. The structural representation of the hardware (box 206) may be fine-grained wherein data flow between FUs is bound to registers and the corresponding interconnect is synthesized, or may be coarse-grained wherein data flows are modeled as virtual links between producing and consuming FUs. An example of coarse-grained structural representation is shown in FIG. 3, where the data flow from FU1 to FU3 is modeled as wire 301, register 302, and wire 303, and the data flow from FU1 to FU6 is modeled as wire 304. The level of detail included in the structural representation of the digital circuit may be controlled externally. Timing tracker 205 works with all such possible structural representations.

At each scheduling/binding step, timing tracker 205 receives new values for input 202. Timing tracker 205 performs analysis to determine whether scheduling and binding the operation as given by the alternative will meet the clock frequency requirement in the context of prior scheduling and binding decisions. Step 207 identifies all scheduled operations that may cause flow dependency conflicts if the operation given in input 202 were to be placed on the alternative given in input 202. Placement of an operation on a given alternative means that the operation will be scheduled to execute at the clock cycle corresponding to the alternative and will execute on the FU corresponding to the alternative. A flow dependency conflict is caused when an operation produces data after this data is consumed by another operation.

In step 208, a directive is issued to the hardware structural representation module 206 to compute the hardware structure based on: the previously made scheduling and binding decisions, input 202, and any flow dependence conflicting operations that were identified in step 207. The structural representation may be built from scratch every time timing tracker 205 receives new values for input 202, or the structure may be kept persistent during the scheduling/binding process and incrementally updated every time step 208 is invoked, i.e., every time the validity determination is performed. The timing tracker works with all such possibilities for maintaining the structural representation. In the embodiment where updating to the hardware structure is done incrementally, the hardware structural representation is updated with the additional data flow relationships that would be introduced by scheduling this operation at the clock cycle given by the alternative and on the FU given by the alternative.

FIG. 3 illustrates updating to the internal hardware structure representation when the timing tracker receives an input 202 (FIG. 2) that specifies that an operation, for example OP1, is to be validated on a specified alternative, for example, <clock cycle=17, functional unit=FU1>. Here, as a result of updating the internal hardware structure representation, wires 304, 306 and 307 (as shown in bold) are added to model the data flow relationships that get bound as a result of scheduling OP1 at clock cycle 17 on functional unit FU1.

In step 209, timing analysis is performed on the computed structural representation. If the structural representation is coarse-grained (i.e., the storage and interconnect are not modeled exactly), then, in order to perform the timing analysis, parameters that are needed by the macrocell delay functions ($\Delta in_i$, $\Delta out_i$, and $\Delta thru_{i,j}$) may need to be approximated. These parameters include fan-ins, fan-out capacitances, and widths. Fan-in refers to the number of inputs for each switching logic element required to steer the data values from an FU or register to another register or FU (for e.g., the number of inputs to a multiplexer). Fan-out capacitance refers to the load capacitance on all FU, register and logic element outputs. These approximations may be made prior to scheduling and binding, based on the expected values for these parameters, or they can be made during scheduling and binding, in which case, these values are recomputed every time the structure is updated. Each of these scenarios are within the scope of the present invention. These parameters are then used to derive the exact delay values for all hardware resources in the hardware structure using the $\Delta in_i$, $\Delta out_i$, $\Delta thru_{i,j}$ functions associated with each resource in the macrocell library. The timing analysis is performed on the hardware structure based on these delay values.

The timing analysis step 209 may be performed on the entire hardware structure, or incrementally, i.e., only on the portion of the hardware structure where timing is affected as a result of the structure update. For example, in FIG. 3, as a result of the structure update described above, the portion of the hardware structure whose timing is affected is shown as within region 305. Region 305 includes any hardware resource whose fan-in, fan-out capacitance, or width has changed due to the structure update, and all hardware resources along any circuit path whose timing changes as a result. The present invention covers timing analysis step 209 performed both non-incrementally and incrementally. Timing analysis, in this context, refers to the process of checking that every circuit path meets the timing constraint. It will be understood that any timing analysis algorithm may be used, such as, for example, the timing analysis disclosed in U.S. patent application Ser. No. 10/266,830 entitled "SYSTEM FOR AND METHOD OF CLOCK CYCLE-TIME ANALYSIS USING MODE-SLICING MECHANISM", filed concurrently herewith and incorporated by reference herein in its entirety.

Referring back to FIG. 2, in step 210, if the timing constraints have been satisfied in step 209, a true signal is generated at step 211 to scheduler/binder 201. Otherwise, a false signal is generated at step 212 and transmitted to scheduler/binder 201. In one embodiment of the present invention a Boolean flag is set to true (step 211) or false (step 212) as a result of the timing constraint satisfaction check performed at step 210. In either event, in step 213, a directive is issued to the hardware structural representation module 206 to restore the hardware structural representation to the state it had when the timing tracker 205 was invoked for a new input 202. The timing tracker now returns control back to the scheduler and binder 201.

Figure 4:
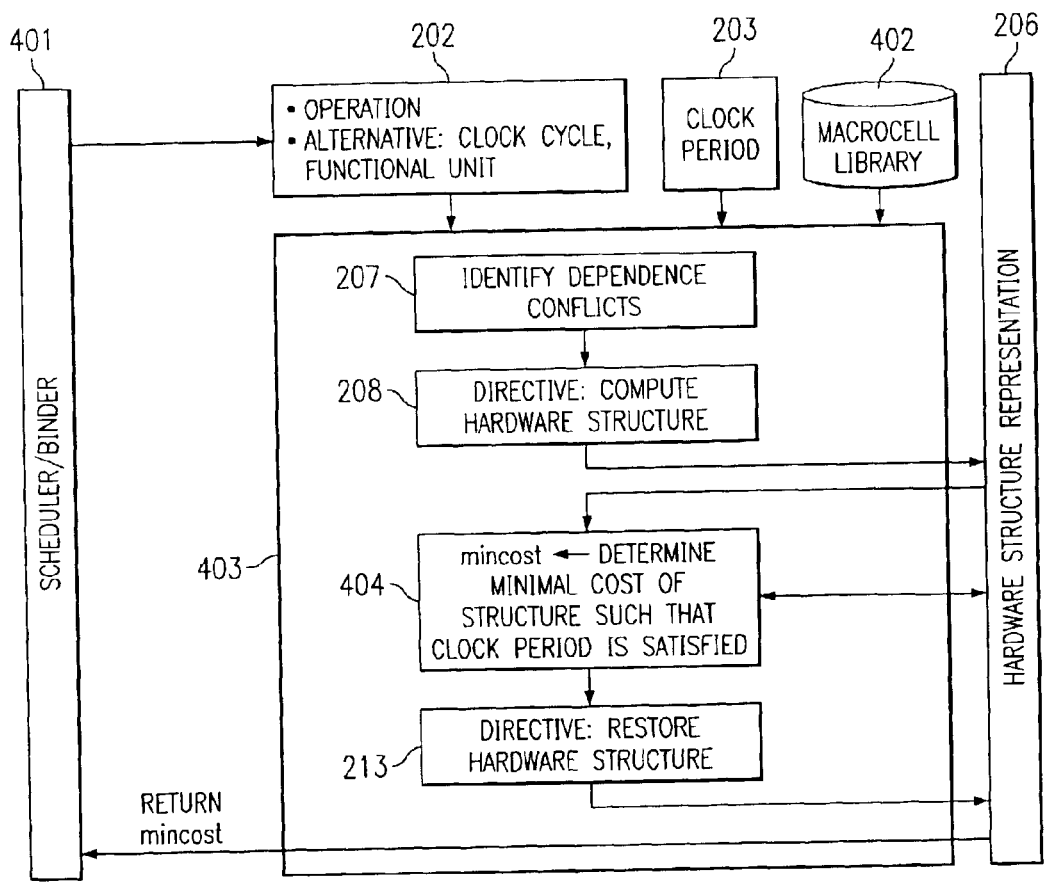
FIG. 4 shows a flow diagram of the mechanism to enable scheduling and binding to produce minimal cost hardware while still meeting the given clock frequency.

Another embodiment of the present invention may be used to minimize the cost of a digital circuit while meeting the timing constraints imposed by the clock frequency. FIG. 4 is a flow diagram of the mechanism for selecting minimal cost alternatives in the digital circuit that satisfy the timing constraints for an electronic device to be designed. While FIG. 2 describes a method and a system for validating operation/alternative selections for timing correctness, this embodiment of the present invention also reduces overall circuit cost. Scheduler/binder 401 is similar in nature to scheduler/binder 201 of FIG. 2 with the difference that scheduler/binder 401 interfaces with a cost-performance tracker 403 to reduce the overall digital circuit cost by minimizing the amount of silicon used. Cost-performance tracker 403, works in conjunction with scheduler/binder 401 to achieve this objective.

Scheduler/binder 401 provides as input 202 to cost-performance tracker 403, the following: an operation, and an alternative including an alternative clock cycle and an alternative functional unit.

Cost-performance tracker module 403 also receives a clock period specification 203 and has access to macrocell library 402. Macrocell library 402 contains area-delay characteristics for all hardware resources (functional units, registers, multiplexers and other logic-switching elements). In this embodiment the macrocells in the macrocell library represent a set of hardware implementations with different areas and delays. Essentially, the macrocells in this embodiment do not correspond to specific hardware implementations as in the previously described embodiment, but instead correspond to a family of hardware implementations. In this embodiment, the delay for any chosen implementation depends on the area of the chosen implementation, in addition to the other parameters, such as widths, input transition times and capacitive output loads. Similarly, the area for any chosen implementation depends on the delay of the chosen implementation. Areas, in this context, are proportional to the amount of silicon included in the hardware resource and is therefore associated with the cost of the hardware resource.

As the amount of silicon in the hardware resource is increased, the delay is decreased but the cost of the hardware resource is increased. For example, as the delay of an adder is decreased, the silicon area increases and the associated cost is also increased. These area-delay characteristics are typically represented as area delay trade-off curves. The trade-off curves could be expressed in several ways, as a list of area-delay values (tuples), or as a closed-form formula. The present invention is capable of working with any of these representations. Also, for a macrocell with internal latches (e.g., pipelined FUs), there will be a different area-delay curve for each possible micro-architectural choice for that macrocell (e.g. ripple-carry vs. carry-lookahead vs. carry-select for an adder).

Figure 5:
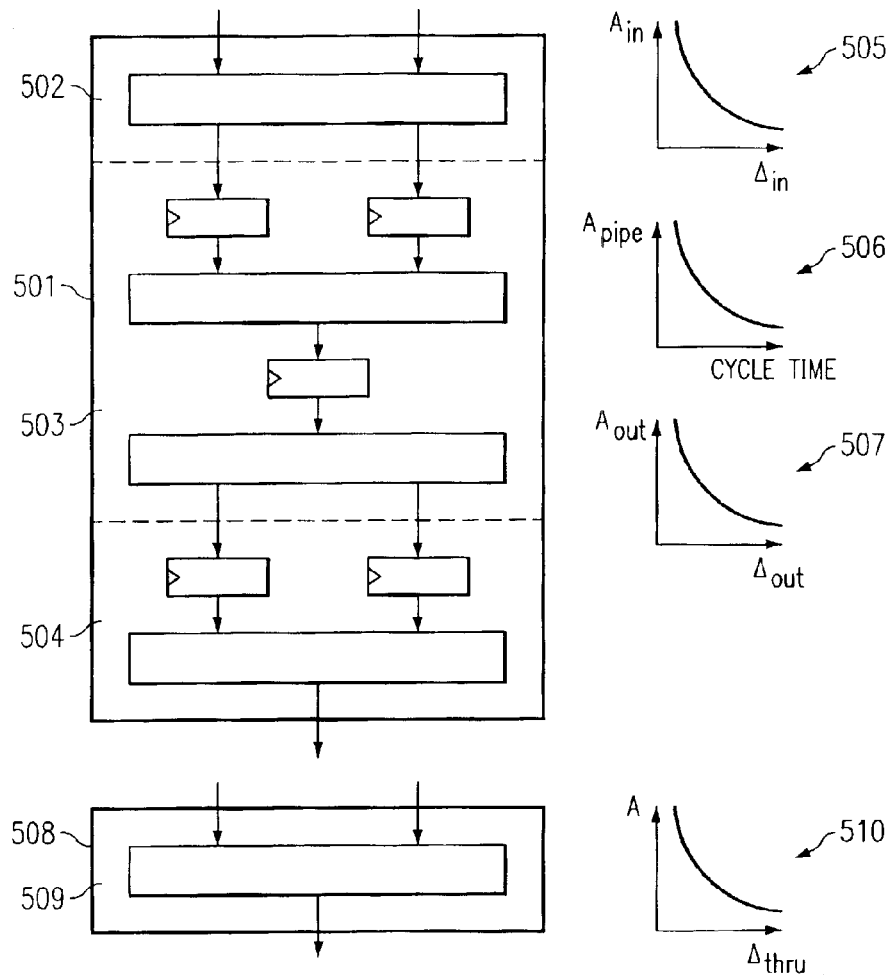
FIG. 5 shows a hardware resource and some typical area-delay characteristics.

FIG. 5 shows two examples of (i) macrocell 501 and its area-delay characteristics represented as area-delay curves 505, 506 and 507 and (ii) macrocell 508 and its area-delay characteristics represented as area-delay curve 510. Here, "$A_{in}$" 502 refers to the area of that portion of the macrocell that consists of all combinational logic from the macrocell inputs up to the set of pipelining registers first encountered within the macrocell starting from its inputs. The corresponding area-delay curve is shown by 505. "$A_{out}$" 504 refers to the area of that portion of the macrocell which consists of the set of pipelining registers first encountered within the macrocell starting going backwards from its outputs, and all combinational logic between these registers and the macrocell outputs. The corresponding area-delay curve is shown by 507. "$A_{pipe}$" 503 refers to the area of that portion of the macrocell which consists of the first and all intermediate set of pipelining registers, and all intervening combinational logic. The corresponding area-delay curve is shown by 506. For the example of a combinational macrocell 508, "A" 509 refers to the total area. The corresponding area-delay curve is shown by 510.

Returning to FIG. 4, at each scheduling/binding step, cost-performance tracker 403 receives new values for input 202. Cost-performance tracker 403 performs analysis to determine a comparative cost of the hardware resulting from scheduling and binding the operation as given by the alternative in the context of prior scheduling and binding decisions, while still meeting the clock frequency requirement. Upon receiving new values for input 202, steps 207 followed by step 208 are performed. These steps have already been described in the context of FIG. 2.

Next, step 404 determines the minimal relative cost of the computed hardware structural representation such that the specified clock period input 203 is satisfied. This determination can be done in several ways.

In one embodiment of step 404, this is posed as a numerical optimization problem:

min $\Sigma A$ such that $\forall p, \Sigma_p \Delta \leq T$ where "min $\Sigma A$" means minimize the sum of the areas of all components, and "$\forall p, \Sigma_p \Delta \leq T$" means for every circuit path p ("$\forall p$") the path delay, i.e., the sum of the delays of all components along that path p ("$\Sigma_p \Delta$"), is less than or equal to the input clock period 203 ("$\leq T$"). This numerical optimization problem is non-linear because of the non-linear nature of the macrocell area-delay characteristics.

In another embodiment of step 404, time-budgeting can be used to partition the clock cycle time amongst the registers, the interconnects and the FUs along each circuit path. In this manner the delay constraints on each individual hardware resource are obtained and analyzed to ensure that timing considerations are satisfied. The area-delay characteristics are used to determine the minimum area implementation for each hardware resource such that the delay constraints for the hardware resource are satisfied.

Figure 6A:
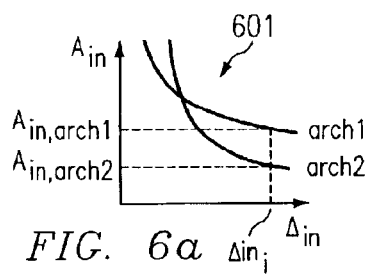
FIGS. 6a, 6b and 6c show area-delay characteristics for a pipelined functional unit with two different micro-architectural choices.
Figure 6B:
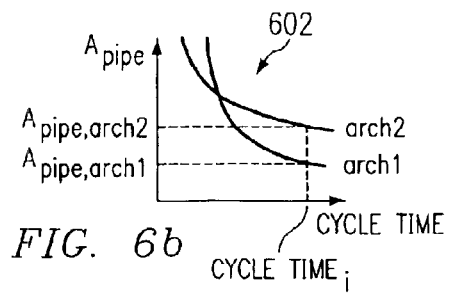
Figure 6C:
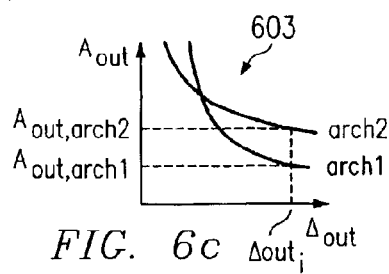

Additionally, choices concerning variations among micro-architectural choices for each FU macrocell are also included as part of the analysis. For example, a pipelined FU macrocell may have two different micro-architectural implementations, e.g., arch1 and arch2, represented by representative area-delay trade-off curves 601–603 of FIG. 6. A minimal area implementation such that the delay constraints ($\Delta in_i$, cycle time, $\Delta out_i$,) are met is $$\min(A_{in,arch1}+A_{pipe,arch1}+A_{out,arch1}, A_{in,arch2}+A_{pipe,arch2}+A_{out,arch2}).$$

Similar to step 209, step 404 may be performed for all hardware resources in the hardware structure, or may be done only for the portion of the hardware structure where timing is affected as a result of the structure update step 208. The present invention covers step 404 performed both non-incrementally and incrementally.

Subsequently, in step 213, a directive is issued to the hardware structural representation module 206 to restore the hardware structural representation to the state it had when the cost-performance tracker 403 was invoked for a new input 202. The cost-performance tracker now returns control back to the scheduler and binder 401.

The second described embodiment ensures the selection of alternatives for operations that are both minimal cost and are timing correct. This enables the objective of minimizing the silicon area while utilizing the entire specified clock period for computation. This approach is superior to previous approaches in that the minimum cost hardware is derived accurately and used to guide alternative selections at each step of the design process.

What is claimed is:

1. A method of satisfying circuit timing requirements during a circuit design process, comprising the steps of:
   receiving a clock cycle-time constraint;
   receiving an operation and an alternative hardware resource for performing the operation;
   receiving a delay characteristic of the alternative hardware resource from a macrocell library; and
   determining validity of the alternative hardware resource with respect to timing constraints, including at least the clock cycle-time constraint, using a hardware structural representation of the circuit and the delay characteristic of the alternative hardware resource.

2. The method of claim 1 further including: reporting said validity to said circuit design process.

3. The method of claim 1 wherein said circuit design process is a scheduler/binder.

4. The method of claim 1 wherein the hardware structural representation is fine-grained.

5. The method of claim 1 wherein the hardware structural representation is coarse-grained.

6. The method of claim 1 wherein the hardware structural representation is persistent and is incrementally updated every tine a new alternative is received.

7. The method of claim 6 wherein the timing analysis is performed on that portion of the hardware structural representation whose timing is changed as a result of the update to the hardware structural representation.

8. The method of claim 1 wherein the hardware structural representation is built from scratch every time said validity determination is performed.

9. The method of claim 1 wherein said validity determination is performed using timing analysis.

10. The method of claim 1 wherein the timing analysis is performed on the entire hardware structural representation.

11. The method of claim 1 wherein the parameters for said delay characteristic functions are estimated using the hardware structural representation.

12. The method of claim 11 wherein the parameters include fan-in at each hardware resource.

13. The method of claim 11 wherein the parameters include fan-out capacitance for each hardware resource.

14. The method of claim 11 wherein the parameters include width of each hardware resource.

15. The method of claim 1 wherein the delay characteristics include $\Delta in_i$, $\Delta out_i$, and $\Delta thru_{i,j}$.

16. The method of claim 1 wherein said clock cycle-time constraint is a clock period.

17. The method of claim 1 wherein the said clock cycle-time constraint is a clock frequency.

18. The method of claim 1 further comprising receiving an alternative clock cycle for the operation and determining validity of the alternative clock cycle.

19. A method of satisfying circuit timing requirements during a circuit design process, comprising:
receiving a clock cycle-time constraint;
receiving an operation and an alternative hardware resource for the operation;
receiving an area-delay characteristic of the hardware resource from a macrocell library; and
determining a comparative cost of the design, while ensuring that the clock cycle-time constraint is still met, by trading-off area with delay of the hardware resources present in the hardware structural representation of the circuit.

20. The method of claim 19 wherein the area-delay characteristics include area-delay trade-off curves.

21. The method of claim 20 wherein the area-delay trade-off curves are expressed as tuples.

22. The method of claim 20 wherein the area-delay trade-off curves are expressed as a closed-form formula.

23. The method of claim 19 wherein the said trading-off is done using numerical optimization.

24. The method of claim 19 wherein the said trading-off is done using time-budgeting.

25. A computer program stored on a computer readable media, the computer program for satisfying circuit timing requirements during a circuit design process, the computer program comprising:
computer code for receiving a clock cycle-time constraint;
computer code for receiving an operation and an alternative hardware resource for the operation;
computer code for receiving a delay characteristic of the hardware resource from a macrocell library; and
computer code for determining validity of the received alternative with respect to timing constraints, including at least the clock cycle-time constraint, using a hardware structural representation of the circuit and the delay characteristic of the alternative hardware resource.

26. The computer program of claim 25 further comprising computer code for receiving an alternative clock cycle for the operation and determining validity of the alternative clock cycle.

* * * * *